United States Patent [19]

Otsuka et al.

[11] Patent Number: 5,288,006
[45] Date of Patent: Feb. 22, 1994

[54] METHOD OF BONDING TAB INNER LEAD AND BONDING TOOL

[75] Inventors: Yasuhiro Otsuka; Hideki Kaneko, both of Tokyo, Japan

[73] Assignee: NEC Corporation, Japan

[21] Appl. No.: 859,155

[22] Filed: Mar. 27, 1992

[30] Foreign Application Priority Data

Mar. 27, 1991 [JP] Japan .................................. 3-85895
Oct. 25, 1991 [JP] Japan .................................. 3-279370

[51] Int. Cl.$^5$ ............................................ H01L 21/607
[52] U.S. Cl. .................................. 228/111; 228/179.1; 228/180.21
[58] Field of Search ............ 228/110, 111, 179, 180.2, 228/1.1

[56] References Cited

U.S. PATENT DOCUMENTS

| | | | |
|---|---|---|---|
| 3,387,365 | 6/1968 | Stelmak | 228/180.2 |
| 3,391,451 | 7/1968 | Moore | 228/180.2 |
| 3,459,610 | 8/1969 | Dijkers et al. | 228/1.1 |
| 3,607,580 | 9/1971 | Obeda | 228/1.1 |
| 3,683,105 | 8/1972 | Shamash et al. | 228/180.2 |
| 4,189,825 | 2/1980 | Robillard et al. | 29/574 |
| 4,776,509 | 10/1988 | Pitts et al. | 228/1.1 |

FOREIGN PATENT DOCUMENTS 776822 11/1980 U.S.S.R. .................................. 228/1.1

OTHER PUBLICATIONS

IBM Technical Disclosure Bulletin; J. C. Edwards "No Bump Beam Tape"; vol. 25, No. 4, Sep. 1982, pp. 1948-1949.

*Primary Examiner*—Samuel M. Heinrich
*Attorney, Agent, or Firm*—Ostrolenk, Faber, Gerb & Soffen

[57] ABSTRACT

A bonding tool having a round pointed end smaller than the bonding pad for the semiconductor element is urged with a bonding force $F_1$ and pressed down into the inner lead of a TAB tape such that the bonding tool end and inner lead come in close contact with each other. Then, the bonding force $F_1$ applied to the tool is reduced to $F_2$, while at the same time ultrasonic vibration 17 is applied to the tool, thus effecting bonding of the inner lead to the bonding pad with applied heat and pressure. Unlike the prior art, no bump has to be formed on the bonding pad for the semiconductor element or on an end of the inner lead. It is thus possible to simplify the bonding process and also to reduce the cost of bonding. Further, a highly reliable bond can be realized without causing crack or other damage to the pad structure.

5 Claims, 7 Drawing Sheets

FIG.1
(PRIOR ART)
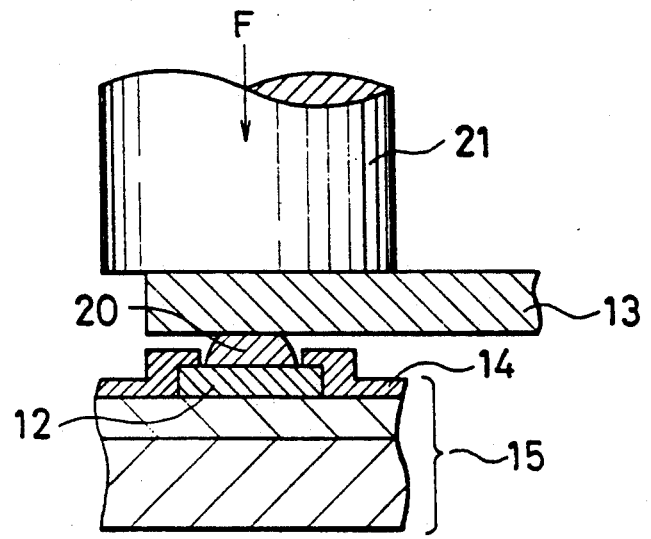
FIG.2A
(PRIOR ART)
FIG.2B
(PRIOR ART)
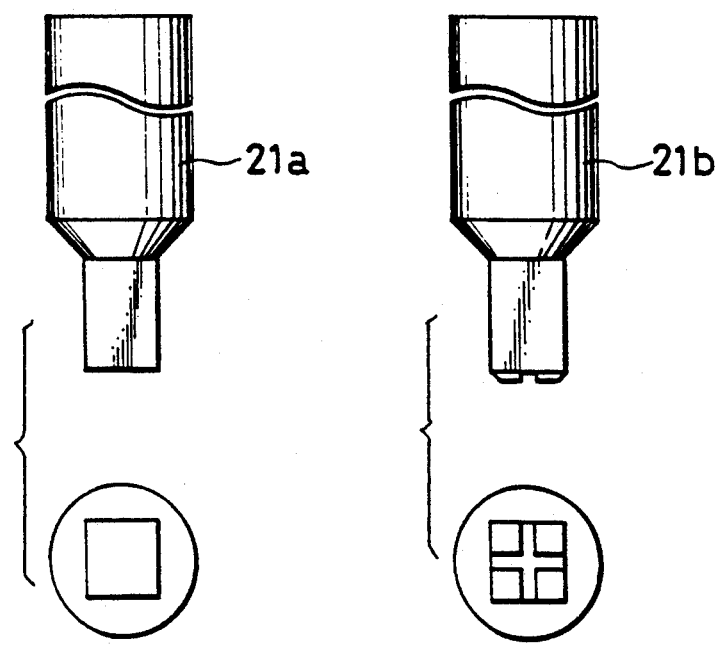

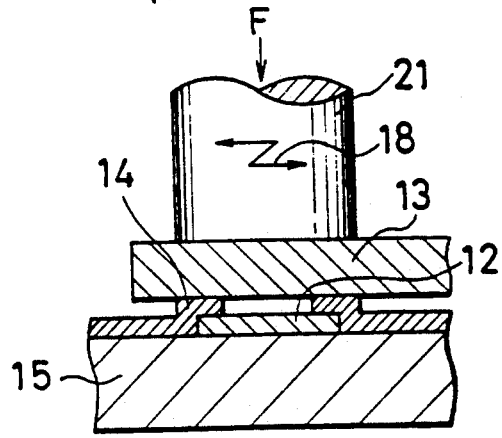
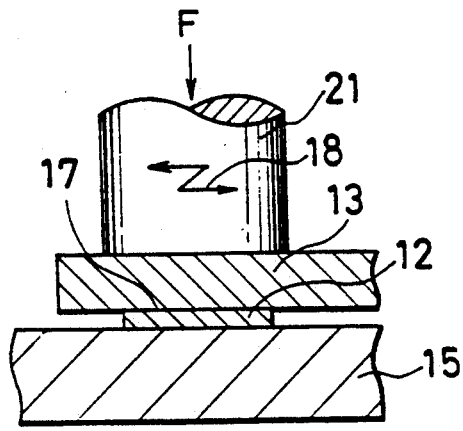
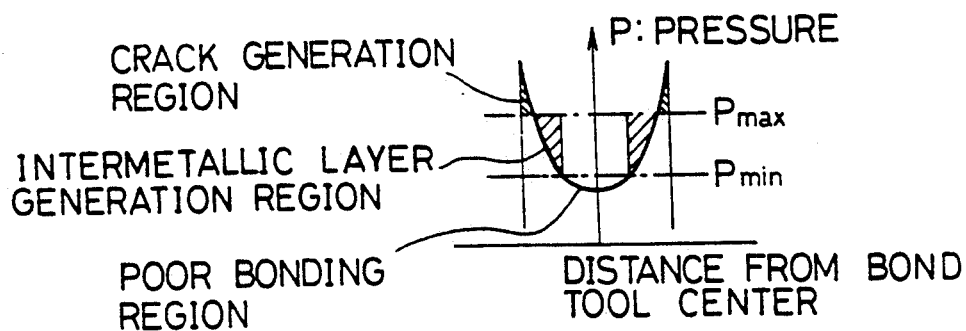
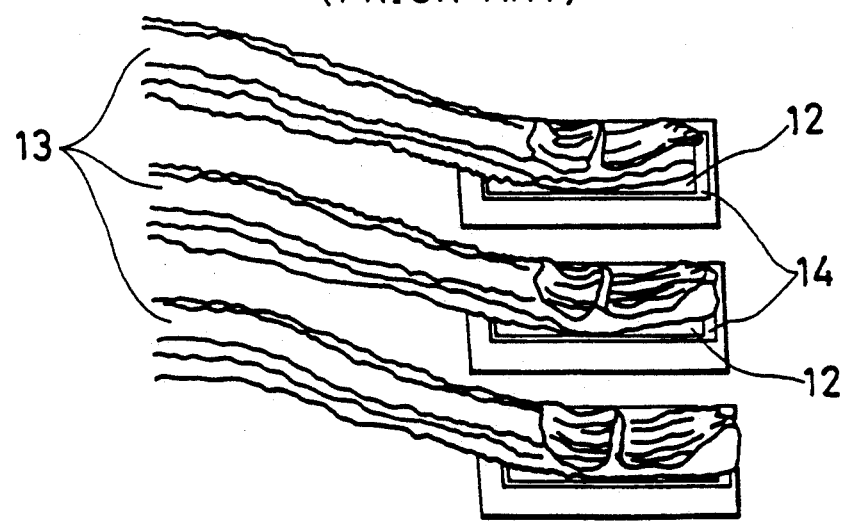

11a

11b

11c

11d

11e

METHOD OF BONDING TAB INNER LEAD AND BONDING TOOL

BACKGROUND OF THE INVENTION

This invention relates to a method of bonding an inner lead of a TAB (tape automated bonding) tape carrier used for the mounting of a semiconductor element and an electrode thereof, an also to bonding tools used for the bonding methods.

FIG. 1 shows a conventional method of bonding an inner lead 13 of a tape carrier with a bonding pad 12 for a semiconductor element 15. In this method, a projection or bump 20 is formed on either the inner lead end 13 or the bonding pad 12, and the two members are bonded together via the bump 20. The bonding is effected using a bonding tool 21 as shown in FIG. 2A or 2B. The bonding tool 21 has a flat free end face, which has a size usually greater than the width of the inner lead 13 and almost equal to the size of the bonding pad 12. FIG. 2A shows a typical bonding tool 21a having a flat free end face, and FIG. 2B shows another typical bonding tool 21b having a flat free end face with a small raised cross portion.

In the prior art method of bonding the TAB inner lead, the bump is necessary for the following two major reasons. Firstly, the edges of the semiconductor element bonding pad 12 is covered by a passivation film 14, which is raised with respect to the bonding pad 12 surface, as shown in FIG. 3A. Therefore, it is very difficult to make the inner lead 13 directly contact with the bonding pad 12 when using the prior art bonding pad. Although the inner lead 13 is not held in contact with the passivation film 14 in its orthogonal direction (not shown), because the aperture or window of the passivation film 14 which is exposed through the electrode surface 12 is usually made greater than the width of the inner lead 13, the inner lead 13 is held in contact with the passivation film 14 in its longitudinal direction as shown in FIG. 3A. Therefore, it is very difficult to place the inner lead 13 in direct contact with the bonding pad surface 12 by using the prior art bonding tool 21, which has an end face with equal level in size to the bonding pad. For this reason, it is necessary to provide either individual bonding pads 12 or individual inner lead 13 with projections or bumps 20.

The second reason is that even if the contact of leads 13 with bonding pads surface 12 could be obtained as shown in FIG. 3B, the method of directly connecting the inner lead 13 to the bonding pad 12 is liable to cause cracking or damage in the pad structure 12 during bonding process. The inner lead 13 is usually comprised of a copper core surrounded by a gold or tin covering. Copper is hard and less capable of deformation compared to gold, which is a regular material of the bump. Therefore, when a bonding force is applied, it causes excessive stress concentration in the neighborhood of the contact area between the inner lead 13 edge and the bonding pad surface as shown in FIG. 3C. When ultrasonic vibration 18 is applied to a bonding tool 21 in this state, damage in the pad structure is liable to be produced in the neighborhood of the inner lead 13 edge where excessive stress concentration is produced.

Therefore, the bonding is normally effected via a bump 20 as shown in FIG. 1, which is soft like a gold bump to thereby avoid stress concentration, thus obtaining the bonding with sufficient strength without generation of any damage in the electrode or pad structure 12. This is so because the soft bump 20 is deformed before the applied pressure reaches a great value able to generate cracking in the pad structure 12.

The bumps may be formed on the bonding pads for a semiconductor element by various ways. For instance, a projection or bump is formed directly on the bonding pad by using electroplating technique, as disclosed in "ISHM'87 Proceedings", 1987, pp449–456 or "ISHM'88 Proceedings", 1988, pp117–124, or by a pedestal process using photoengraving techniques, in which the inner lead is half etched while masking a bump area, thus forming a raised portion or bump with a height of 30 to 40μ, as disclosed in "1991 JAPAN IBMT SYMPOSIUM", WB2-02, 1991, pp81–84, or by a transfer bump process, in which a bump is formed on a glass substrate and then transferred onto a bonding pad, as disclosed in "IMC 1988 Proceedings", 1988, pp440–443.

In a further conventional process as shown in FIG. 4, an inner lead 13 is directly connected to a bonding pad for a semiconductor element 12 without formation of any bumps but by a thermosonic process like wire bonding process, as disclosed in U.S. Pat. No. 4,842,662. The process of directly bonding the inner lead to the bonding pad for the semiconductor element without formation of any bumps will hereinafter be referred to as direct bonding process. In the prior art direct bonding process disclosed in U.S. Pat. No. 4,842,662, the bonding is effected by using a bonding tool having a greater end face than the width of the inner lead and applying ultrasonic vibration thereto in the longitudinal direction. Further, the passivation film aperture over the bonding pad for the semiconductor element 12 is greater than the width of the inner lead 13.

As shown above, in the prior art method of bonding the TAB inner lead, it is normally necessary to form a bump on either a bonding pad for a semiconductor element or an inner lead. The bump formation usually requires a complicated electroplating method or like process as well as expensive equipment. Besides, it is difficult to attain 100 per cent bump formation yield rate. Further, in the bump formation process, damage to expensive semiconductor element or expensive TAB tape is liable. For the above reasons, the prior art TAB inner lead bonding process requiring the bump formation process leads to high assembly cost.

Furthermore, the other prior art of direct bonding process, using a bonding tool whose head is greater in end size than the width of the inner lead, is prone to cause any cracking in the pad structure, such as passivation cracking and substrate cracking under the bonding pad. This is thought to be attributable to the following cause. Referring to FIG. 3C, the $P_{min}$ value is defined as the minimum pressure value on the bond area, which can attain bonding an inner lead directly with a bonding pad, and the $P_{max}$ value is defined as the maximum pressure value on the bond area, which would not cause any cracking in the pad structure but could attain bondly an inner-lead directly with a bonding pad. In order to avoid crack or like damage to the pad structure 12, it is necessary to apply a bond force to the bonding tool 21 such that the effective pressure in the bond area 17 is lower than $P_{max}$. The bonding is not effected in a region under a pressure lower than $P_{min}$, because the inner lead 13 and the bonding pad 12 is in poor contact with each other. For obtaining the bonding while avoiding the generation of cracking in the pad strucutre, it is necessary that the actual pressure between the inner lead and the bonding pad is lower than $P_{max}$ and also that the region under pressure of $P_{min}$ is as small as possible. To this end, it is important that the pressure distribution over the bond area is as uniform as possible. In the prior art direct bonding process, however, stress concentration occurs in the neighborhood of the inner lead 13 edge and it leads to crack generation. To prevent the crack generation, it is necessary to reduce either the bond force or the ultrasonic energy applied to a bond tool. However, it has been difficult to obtain bonding with sufficient strength without causing any cracking in the pad structure.

Moreover, in the prior art direct bonding process, it is difficult to obtain good bonding properties, such as strong bond strength with all over the connections, in case of a semiconductor element having all the four sides thereof formed with bonding pads. The prior art bonding can be effected with a semiconductor element having only few opposed sides formed with bonding pads by applying ultrasonic vibration in the longitudinal direction thereof.

SUMMARY OF THE INVENTION

An object of the invention is to provide a method of bonding a TAB inner lead, which is free from any bump formation process and which permits cost reduction, thus solving the problems inherent in the prior art as discussed above.

Another object of the invention is to provide a method of bonding a TAB inner lead, which permits connection of an inner lead to a semiconductor element having the four sides thereof all formed with bonding pads without formation of any bump.

A further object of the invention is to provide a method of bonding a TAB inner lead, which permits sufficiently strong and highly reliable bond without possibility of causing crack or like damage to the bonding pads for the semiconductor element.

In the first mode of the invention, there is provided a method of bonding a TAB inner lead to a semiconductor element by a single point bonding process, comprising pressing a bonding tool having an end smaller in size than the bonding pad for the semiconductor element into the inner lead to form an impression therein, and then applying a ultrasonic vibration to the bonding tool.

In the second mode of the invention based on the first mode of the invention, the second bond force applied to the bonding tool when applying the ultrasonic vibration is applied to an extent lower than the first bond force applied when pressing the bonding tool into the inner lead.

In the third mode of the invention based on either of the first and second modes of the invention, the bonding tool has a round pointed end smaller in size than a passivation film aperture through which a bonding pad for a semiconductor element is exposed.

In the fourth mode of the invention based on either of the first to third modes of the invention, the inner lead pressed with the bonding tool is projected such that it comes in contact with a bonding pad for a semiconductor element exposed through the passivation film aperture.

In the fifth mode of the invention based on either of the first to fourth modes of the invention, the passivation film aperture over the semiconductor element electrode has a dimension in the width direction of an inner lead smaller than the width of the inner lead.

In the sixth mode of the invention, there is provided a bonding tool for bonding a TAB inner lead to a bonding pad for a semiconductor element by a single point bonding process, the bonding tool having a round pointed end.

BRIEF DESCRIPTION OF THE DRAWINGS

FIG. 1 is a side view showing a prior art method of bonding a TAB inner lead via a bump;

FIGS. 2A and 2B are side view illustration showing the prior art bonding tools;

FIGS. 3A, 3B and 3C are schematic illustration for explaining the reason why bump formation was necessary in the prior art TAB inner lead bonding method;

FIG. 4 is schematic illustration of a prior art bonding process of directly connecting an inner lead to a bonding pad for a semiconductor element without bump formation;

DESCRIPTION OF THE INVENTION

The invention will now be described with reference to the drawings. In the method of bonding a TAB inner lead according to the invention, there is utilized a bonding tool 11a as shown in FIGS. 5A and 5B, having an end smaller in size than a passivation film opening over a bonding pad 12 of a semiconductor element 15.

Figure 5A:
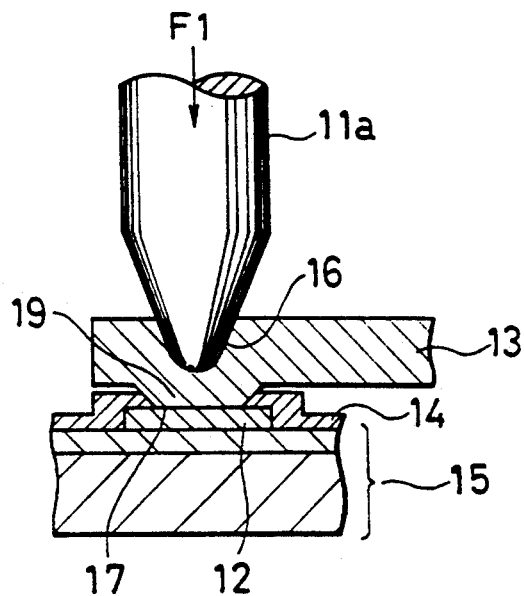
FIGS. 5A and 5B schematically illustrate step by step a method of bonding an inner lead according to the invention.

As shown in FIG. 5A, after aligning an inner lead 13 with a bonding pad 12 for the semiconductor element 15, the bonding tool 11a is pressed down into the inner lead 13 to form a recess or impression 16 on the inner lead 13, as a result of transforming the bonding tool 11a end shape. The bonding tool 11a is thus held in close contact with the inner lead 13. At this time, a portion of lead is forced to form a small projection with roundish edge on the opposite side of the inner lead 13, and the inner lead 13 thus can be held in direct contact with the bonding pad surface 12. The inner lead 13 is held in contact with the passivation film 14 surrounding the bonding pad 12, as shown in FIG. 5A. However, because of the use of the bonding tool 11a having a smaller end than the exposed bonding pad 12, the inner lead 13 can be held in contact with the bonding pad surface 12 without generaton of such excessive force as to cause damage to the passivation film 14.

Figure 5B:
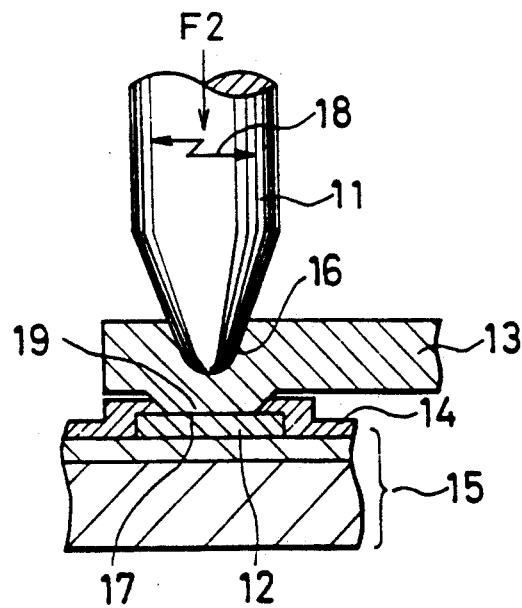

Then, while the state of contact as shown in FIG. 5A is held, ultrasonic vibration 18 is applied to the bonding tool 11a as shown in FIG. 5B, whereby the inner lead 13 and the bonding pad 12 can be bonded together. At this time, the semiconductor element 15 has been heated by a heater (not shown) to a temperature necessary for the formation of an intermetallic layer.

In the first mode of the invention, the bottom of the inner lead 13 is formed with a small round raised portion 19. Thus, unlike the prior art direct bonding process, such excessive stress concentration as to cause any cracking in the pad structure can be avoided and permit the bonding to be effected with sufficient bond strength.

The second mode of the invention will now be described. Generally, the bonding strength increases with an increase in a bonding force. However, with increase of the bonding force, the possibility of generation of crack in the pad structure is increased. This means that an upper limit may exist with respect to the bonding force. The increase of the bonding strength with increasing bonding force is thought to be based on the following mechanism. The surface of the inner lead bottom raised portion has fine irregularities. Therefore, where the bonding load is not so much, the actual contact area is far smaller than the apparent contact area. Consequently, the bonding strength is insufficient. Where the bonding load is sufficient, on the other hand, the fine irregularities of the inner lead bottom raised portion undergo plastic deformation, and the surface of the raised portion comes to follow the electrode surface, thus increasing the actual contact area. An intermetallic layer is thus formed over a wide area. This is thought to be the reason why the bonding strength is increased.

Figure 6:
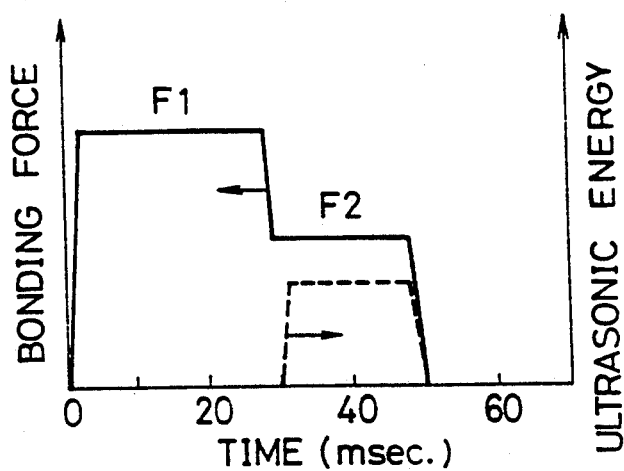
FIG. 6 is a graph showing a relation between bonding force applied to bonding tool and ultrasonic energy.

Accordingly, in the second mode of the invention, as shown in FIG. 6, the second bonding force $F_2$ applied while applying the ultrasonic vibration is extremely reduced from the first bonding force $F_1$ applied when the bonding tool is pressed into the inner lead. Since the reduced second bonding force $F_2$ is applied for application of the ultrasonic vibration after increasing the actual contact area between the inner lead bottom raised portion and the bonding pad surface by applying the sufficient first bonding force $F_1$, it is possible to prevent the crack generation and obtain the bonding with a sufficient bond strength. Usually, by reducing the second bonding force $F_2$ when applying the ultrasonic vibration, slip might be liable to be generated between the bonding tool and the inner lead, thus reducing the bonding strength. According to the invention, however, the bonding tool end can be brought into close contact with the recess formed in the inner lead when applying the first bonding force $F_1$. Thus, bonding can be obtained with sufficient bond strength even by reducing the second bonding force $F_2$ when applying the ultrasonic vibration, as confirmed by experiments.

Figure 7A:
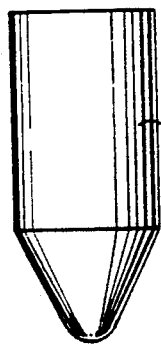
FIGS. 7A, 7B, 7C, 7D and 7E are side view illustration of bonding tools.

The third mode of the invention will now be described. As empirically confirmed, by using a bonding tool 11a having a round pointed end as shown in FIGS. 7A to 7D, bonding can be obtained with a greater strength and thus with improved reliability compared to the case of using a bonding tool 11e having a flat end as shown in FIG. 7E.

Figure 7E:
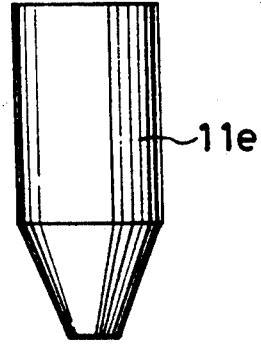
Figure 8A:
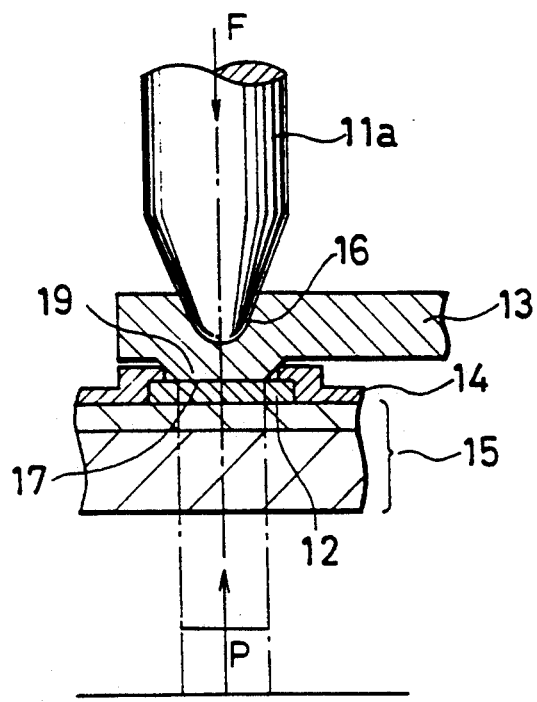
FIGS. 8A and 8B are schematic illustration for explaining bonded states obtained with a bonding tool having a round pointed end smaller than the width of inner lead and a bonding tool having a flat end smaller than the width of inner lead.
Figure 8B:
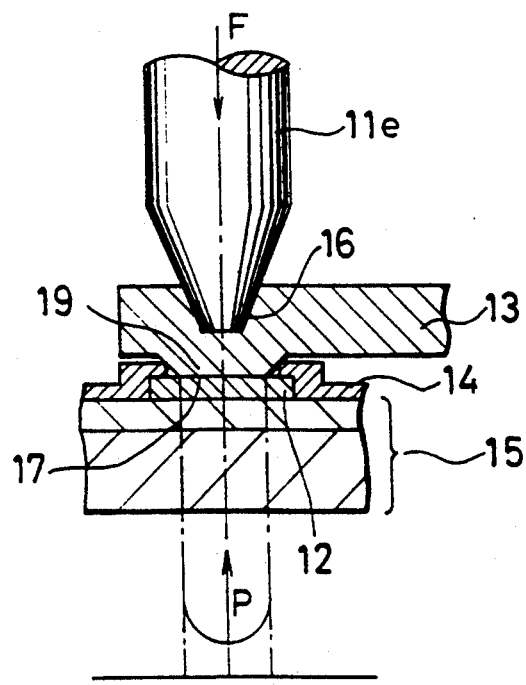

The reason for this is not clear. However, it is thought that with the bonding tool having a round pointed end as shown in FIG. 8A, superior uniformity of the pressure distribution over the junction is obtainable to that obtained in case of using the bonding tool having a flat end as shown in FIG. 8B. It is empirically confirmed that bonding with practically sufficient bond strength is obtainable even with the use of a bonding tool having a flat end as shown in FIG. 7E.

Figure 9A:
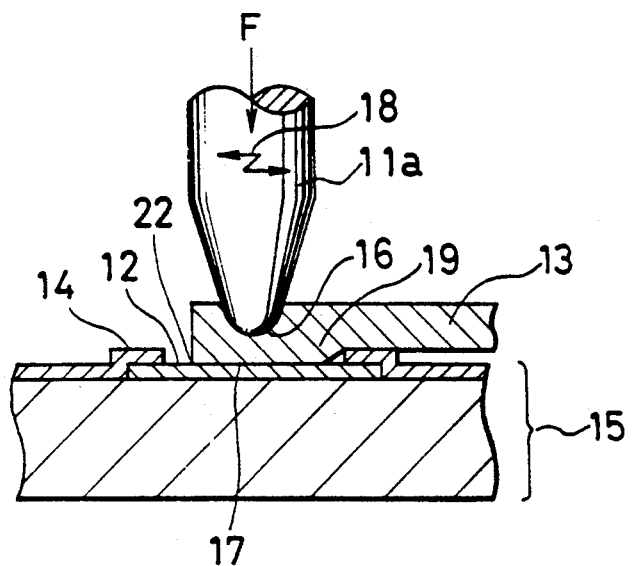
FIGS. 9A and 9B are sectional view illustration of a bonded region with the inner lead end not in contact with passivation film and a bonded region with the inner lead end in contact with passivation film.
Figure 9B:
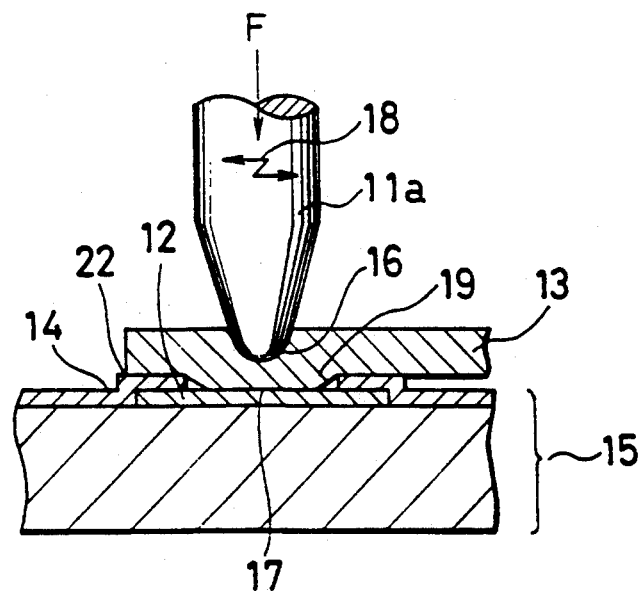

It is empirically confirmed that in the first to third modes of the invention, the bonding strength can be increased by placing the inner lead such that the end thereof is in contact with the passivation surrounding the bonding pad for the semiconductor element. FIGS. 9A and 9B are sectional views showing the junctions in cases when the inner lead 13 end is, respectively, not in contact and is in contact with the passivation film 14 surrounding the bonding pad. In the case with the inner lead end not in contact with the passivation film 14 as shown in FIG. 9A, the inner lead end 22 is in contact with the bonding pad 12. If ultrasonic vibration 18 is applied in this state in the longitudinal direction of the inner lead 13, stress concentration is produced in the neighborhood of the inner end 22, and generation of crack in the pad structure 12 is prone. To prevent the crack generation, therefore, it is necessary to reduce either the bonding force F or output power of the ultrasonic energy. By so doing, however, the bonding strength is reduced. If the inner lead end 22 is in contact with the passivation film 14, on the other hand, the inner lead end 22 is not in contact with the bonding pad surface as shown in FIG. 9B, and the sole raised portion 19 formed on the back surface of the inner lead is in contact with the bonding pad 12. In this case, it is possible to prevent generation of excessive concentration in the junction 17 and obtain bonding with a sufficient bond strength.

Figure 10A:
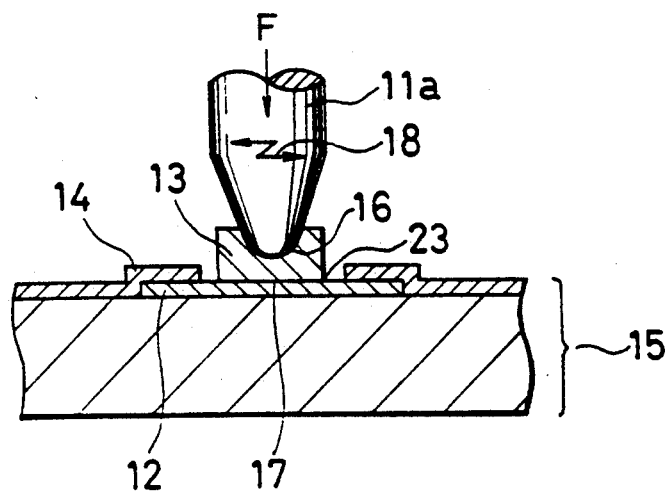
FIGS. 10A and 10B are sectional view illustration showing a contact state of bonded region, in which a passivation film aperture over a bonding pad for a semiconductor element is greater in size than the width of inner lead, and a contact state of bonded region, in which a passivation film aperture over a bonding pad for a semiconductor element is smaller in size than the width of inner lead.
Figure 10B:
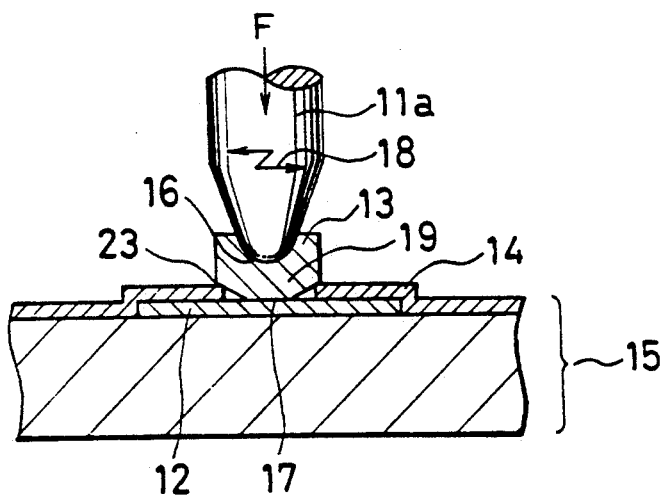

The fifth mode of the invention will now be described. As empirically confirmed, when bonding an inner lead having an orthogonal longitudinal direction to the direction of application of ultrasonic vibration, the bonding strength can be increased by making the aperture over a bonding pad for a semiconductor element smaller than the inner lead width. FIGS. 10A and 10B are sectional views showing bonded states obtained in cases where the aperture the bonding pad 12 is, respectively, greater and less than the width of the inner lead 13. In the case where the aperture over the bonding pad 12 is greater than the width of the inner lead 13 as shown in FIG. 10A, the inner lead edge 23 is in contact with the bonding pad 12. If the ultrasonic vibration 18 is applied in this state in an orthogonal direction to the longitudinal direction of the inner lead 13, stress concentration is generated in the end 23 of the inner lead, and generation of crack in the pad structure 12 is prone. It is necessary for preventing the crack generation to reduce either the bonding force F or the ultrasonic energy 18. By so doing, the bonding strength might be reduced. If the exposed bonding pad surface 12 is less than the width of the inner 13, the inner lead end 23 is not in contact with the bonding pad 12, and the sole raised portion 19 formed on the back surface of the inner lead is in contact with the bonding pad 12 as shown in FIG. 10B. It is thus possible to prevent generation of excessive stress concentration. Consequently, bonding can be achieved without causing any damage in the pad structure with sufficient bonding strength. Further, with the same size of the bonding pad 12, the smaller the opening over the bonding pad 12 the smaller the exposed bonding pad surface, thus providing for the superior environmental resistance of the junction and ensuring the more reliable junction.

The sixth mode of the invention will now be described. In case of bonding a TAB inner lead using bump, with a bonding tool having a round pointed end, the uniformity of pressure distribution is obtained over the junction, which reduce the possibility of the crack generation in the pad structure and realize stable bond with sufficient bond strength.

Examples of the invention will now be described in detail, returning to the drawings. FIGS. 5A and 5B are schematic views showing steps of the method of bonding an inner lead according to the invention, FIG. 6 shows a graph of the bonding force applied to the bonding tool and also of the ultrasonic energy applied to the bonding tool, both plotted in terms of time, and FIGS. 3A to 3E show outline of bonding tools used for bonding TAB inner lead in examples of the invention.

The first example will now be described. The TAB tape used for bonding was prepared such that a copper inner lead with 100 μm width and 35 μm thickness was provided with a 0.6 μm gold plating. The semiconductor element was provided with bonding pads formed along two opposed sides. The bonding tool used had a conical end portion with a rounded end as shown in FIG. 7A. After aligning the bonding pad 12 for the semiconductor element 15 and the inner lead 13 with respect to each other as shown in FIG. 5A, the bonding tool 11a was urged against the inner lead 13 by applying the first bonding force of $F_1 = 60$ gf to the bonding tool 11a. Then, as shown in FIG. 5B, ultrasonic vibration 18 was applied to the bonding tool 11a under an applied load held at $F_2 = 60$ gf, thus effecting the bonding of the inner lead 13 and the bonding pad 12 to each other. The ultrasonic vibration 18 was applied in a direction parallel to the longitudinal direction of the inner lead 13, and the bonding was effected with the inner lead 13 end in contact with the passivation film 14. At the time of the bonding, the semiconductor element 15 was heated by a heater (not shown) to 280° C.

The above operation was performed for all the inner leads 13, and then measurement of the bonding strength and check for cracks generated in the pad structure 12 were carried out. The pull strength was 25 gf or above, indicating sufficient bonding strength. The pad structure 12 was free from any cracking.

The second example will now be described. In this instance, the bonding was effected by a method, in which the second bonding force $F_2$ at the time of the ultrasonic vibration application was reduced compared to $F_1$, as shown in FIG. 6. The bonding tool used as in the first example had a conical end portion with a rounded end as shown in FIG. 7A. The TAB tape and semiconductor elements were also as same as those in the first example.

First, as shown in FIG. 5A, the bonding tool 11a was urged against the inner lead 13 by applying the first bonding force of $F_1 = 100$ gf to the bonding tool 11a. Then, as shown in FIG. 5B, the inner lead 13 and the bonding pad 12 were bonded to each other by applying ultrasonic vibration 18 to the bonding tool 11a while reducing the second bonding force applied to the bonding tool 11a to $F_2 = 40$ gf. As in the first example, the ultrasonic vibration 18 was applied in a direction parallel to the longitudinal direction of the inner lead 13. The bonding was carried out with the inner lead 13 end in contact with the passivation film 14. At the time of the bonding, the semiconductor element 15 was heated at 280° C.

The above operation was performed for all the inner leads 13, and the measurement of the bonding strength and the check for crack in the pad structure 12 were carried out. The pull strength was 45 gf, an increase over the value in the case of the first example. The pad structure was free from any cracking.

The third example will be described. In this instance, the inner lead 13 and the bonding pad 12 were bonded to each other using a bonding tool 11e having a flat end as shown in FIG. 7E and adopting a bonding load sequence similar to that in the second example. The TAB tape and semiconductor element were like those in the first example. With the bonding tool having the flat end, slight cracking was produced in part of the bonding pad 12 under the bonding conditions as those in the second example. Then, the bonding force $F_1$ and $F_2$ applied to the bonding tool 11e and ultrasonic energy were reduced compared to those in the second example. More specifically, the bonding tool 11e was urged against the inner lead 13 by applying the first bonding force of $F_1 = 70$ gf to the bonding tool 11e, and then ultrasonic vibration was applied to the bonding tool 11e while reducing the load applied to the tool 11e to $F_2 = 30$ gf. The ultrasonic vibration 18, like the first and second examples, were applied in a direction parallel to the longitudinal direction of the inner lead 13. The bonding was effected with the inner lead 13 end held in contact with the passivation film 14. At the time of the bonding, the semiconductor element 15 was heated at 280° C.

The above operation was performed for all the inner leads 13, and then the measurement of the bonding strength and check for cracks in the pad structure 12 were carried out. The bonding strength was reduced compared to the case of the second example. However, the average pull strength was 20 gf, a practically sufficient strength for bonding. Further, the pad structure 12 was free from any crack.

The fourth example will now be described. In this instance, the bonding was effected with the inner lead end 22 not in contact with the passivation film 14 surrounding the bonding pad 12, as shown in FIG. 9A. The other conditions were the same as those in the second example. The pull strength was found to be 30 gf, a slight reduction compared to the case of the second example, in which the inner lead end 22 was in contact with the passivation film 14 surrounding the bonding pad 12.

The fifth example will now be described. In this instance, inner lead was bonded to a semiconductor element with bonding pads formed along all the four sides of the element. FIG. 9B shows a sectional view of the junction and the neighborhood thereof in case when the direction of ultrasonic vibration 18 is parallel to the longitudinal direction of the inner lead 13, and FIGS. 10A and 10B show sectional views of the junction and the neighborhood thereof in case when the direction of ultrasonic vibration 18 is normal to the longitudinal direction of the inner lead 13. In the case of FIG. 10A, the dimension of the aperture over the bonding pad in the direction of the width of the inner lead 23 is 120 μm and greater than the width of the inner lead. In the case of FIG. 10B, the dimension of the aperture is 80 μm and less than the width of the inner lead 13. The bonding was effected under the same conditions as those in the second example. With the aperture over the bonding pad 12 being 80 μm, the pull strength was 45 gf or above in the junction, in which ultrasonic vibration 18 was applied in a direction parallel to the longitudinal direction of the inner lead 13, and was 40 gf or above in the junction, in which ultrasonic vibration was applied in a normal direction. With the aperture over the bonding pad 12 being 120 μm and greater than the width of the inner lead 18, the pull strength was 45 gf or above, same as in the case of the aperture of 80 μm, in the junction, in which the ultrasonic vibration was applied in a direction parallel to the longitudinal direction of the inner lead 13. However, in the junction, in which the ultrasonic vibration was applied in a direction normal to the longitudinal direction of the inner lead 13, the pull strength was extremely reduced to be 20 gf or so compared to the case with the aperture size of 80 μm.

Figure 11:
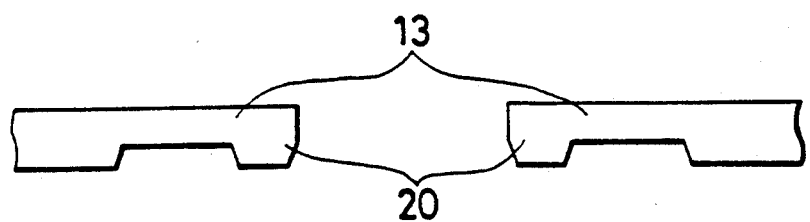
FIG. 11 is a side view showing a TAB tape with a bump formed by half-etching an inner lead end used in an embodiment of the invention.

A sixth example will now be described. In this instance, the bonding is effected by using a TAB carrier tape with a bump, i.e., an inner lead 13 as shown in FIG. 11, which has its end portion half-etched to form a bump 20. The bonding was carried out using a conical bonding tool 11a with a round pointed end as shown in FIG. 7A. The inner lead 13 and the bonding pad 12 were connected to each other under the same conditions as in the second example. The average pull strength was found to be 35 gf and sufficiently high. The pad structure 12 was free from any cracking. The pull strength was slightly reduced compared to the second example because the rupture strength of the inner lead 13 was reduced by the half-etching of its end. In this embodiment, the bonding was carried out by using a bonding tool having an end smaller than the width of the inner lead. However, it was confirmed that the same effects could be obtained by using a bonding tool having an end, which is greater than the width of the inner lead and rounded.

In the above sixth example, the inner lead end is formed with a bump by half-etching. However, it was confirmed that the same effects could be obtained by forming an Au bump on the bonding pad for the semiconductor element or the inner lead end.

In the above first to fifth examples, a conical bonding tool having a rounded end as shown in FIG. 7A was used. However, it was confirmed that the same effects could be obtained by using a bonding tool, which has a round end having a size effective to form a raised portion on the inner lead bottom surface with the first bonding force of $F_1$, the raised portion being in contact with the bonding pad surface. For instance there can be utilized a pyramidal bonding tool 11b having a round end as shown in FIG. 7B or a rod-like bonding tool 11c having a round end as shown in FIG. 7C or a bonding tool 11d having a round end with a small cross projection as shown in FIG. 7D.

Figure 7B:
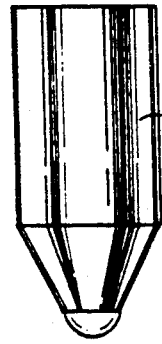
Figure 7C:
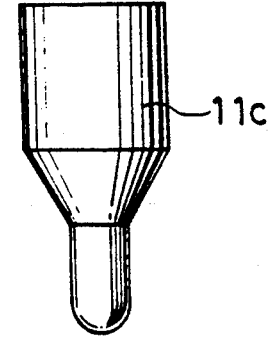
Figure 7D:
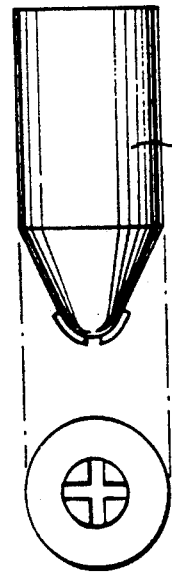

Further, while in the sixth example a conical bonding tool having a round pointed end as shown in FIG. 7A was used, it was confirmed that the same effects could be obtained using a bonding tool having a round pointed end, for instance, the pyramidal bonding tool 11b having a round pointed end as shown in FIG. 7B or the rod-like bonding tool 11c having a round pointed end as shown in FIG. 7C or the bonding tool 11d having a round pointed end with a slight cross projection as shown in FIG. 7D.

As has been described in the foregoing, the method of bonding a TAB inner lead according to the invention does not require any bump formation process and permits extreme reduction of the assembly cost compared to the prior art method. In addition, the bonding method according to the invention permits connection of an inner lead to a semiconductor element having bonding pads formed on all the four sides without formation of any bump. Further, it is possible to bond the bonding pad for the semiconductor element and the inner lead to each other without possibility of crack generation or any other damage in the pad structure and with sufficient mechanical strength.

What is claimed is:

1. A method of bonding a TAB tape inner lead according to claim 9, wherein a bonding force is applied to said bonding tool when said ultrasonic vibration is applied, with said bonding force being less than another bonding force applied when pressing said bonding tool into said inner lead.

2. A method of bonding a TAB tape inner lead to a semiconductor element by a single point bonding process, said method comprising the steps of:
   pressing a bonding tool having an end smaller in size than said semiconductor element bonding pad into said inner lead to form an impression therein, said inner lead pressed by said bonding tool being projected on the opposite side of said inner lead; and
   thereafter applying ultrasonic vibration to said bonding tool.

3. A method of bonding a TAB tape inner lead according to claim 2, wherein said semiconductor element bonding pad is an electrode of a semiconductor element.

4. A method of bonding a TAB tape inner lead according to claim 2, wherein said bonding tool has a round pointed end smaller in size than a passivation film aperture over said semiconductor element bonding pad.

5. A method of bonding a TAB tape inner lead according to claim 2, wherein said semiconductor element bonding pad is exposed through a passivation film aperture having a dimension in the width direction of said inner lead that is smaller than the width of said inner lead.

* * * * *